(12) United States Patent
Kant et al.

(10) Patent No.: US 6,646,951 B2
(45) Date of Patent: Nov. 11, 2003

(54) HIGH PERFORMANCE ADDRESS DECODE TECHNIQUE FOR ARRAYS

(75) Inventors: Shree Kant, Fremont, CA (US); Aparna Ramachandran, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 10 days.

(21) Appl. No.: 10/003,008

(22) Filed: Oct. 23, 2001

(65) Prior Publication Data

US 2003/0076732 A1 Apr. 24, 2003

(51) Int. Cl.$^7$ ................................. G11C 8/00
(52) U.S. Cl. ............... 365/230.06; 365/51; 365/189.08; 326/108
(58) Field of Search ....................... 365/63, 230.06, 365/200, 51, 185.28, 189.11, 189.08; 341/136, 67; 326/95, 108, 93

(56) References Cited

U.S. PATENT DOCUMENTS

| | | | | |
|---|---|---|---|---|
| 5,982,702 A | * | 11/1999 | Bosshart | 365/230.06 |
| 6,049,490 A | * | 4/2000 | Kawasumi | 365/189.07 |
| 6,256,254 B1 | * | 7/2001 | Kwak et al. | 365/230.03 |
| 6,275,442 B1 | * | 8/2001 | Hill et al. | 365/230.06 |
| 6,320,814 B1 | * | 11/2001 | Susuki | 365/230.06 |

* cited by examiner

*Primary Examiner*—Gene Auduong
(74) *Attorney, Agent, or Firm*—Rosenthal & Osha L.L.P.

(57) ABSTRACT

An address decoder having pre-decode logic circuitry positioned in between ends of final decode logic circuitry is provided. Such an address decoder yields less wire load, less gate load, less power consumption, and increased speed due to the pre-decode logic circuitry having to be capable of only driving a signal over half the length of a final decoder. Further, a method to select memory elements from a memory array using centrally positioned pre-decode logic circuitry is provided.

18 Claims, 5 Drawing Sheets

HIGH PERFORMANCE ADDRESS DECODE TECHNIQUE FOR ARRAYS

BACKGROUND OF INVENTION

Figure 1:
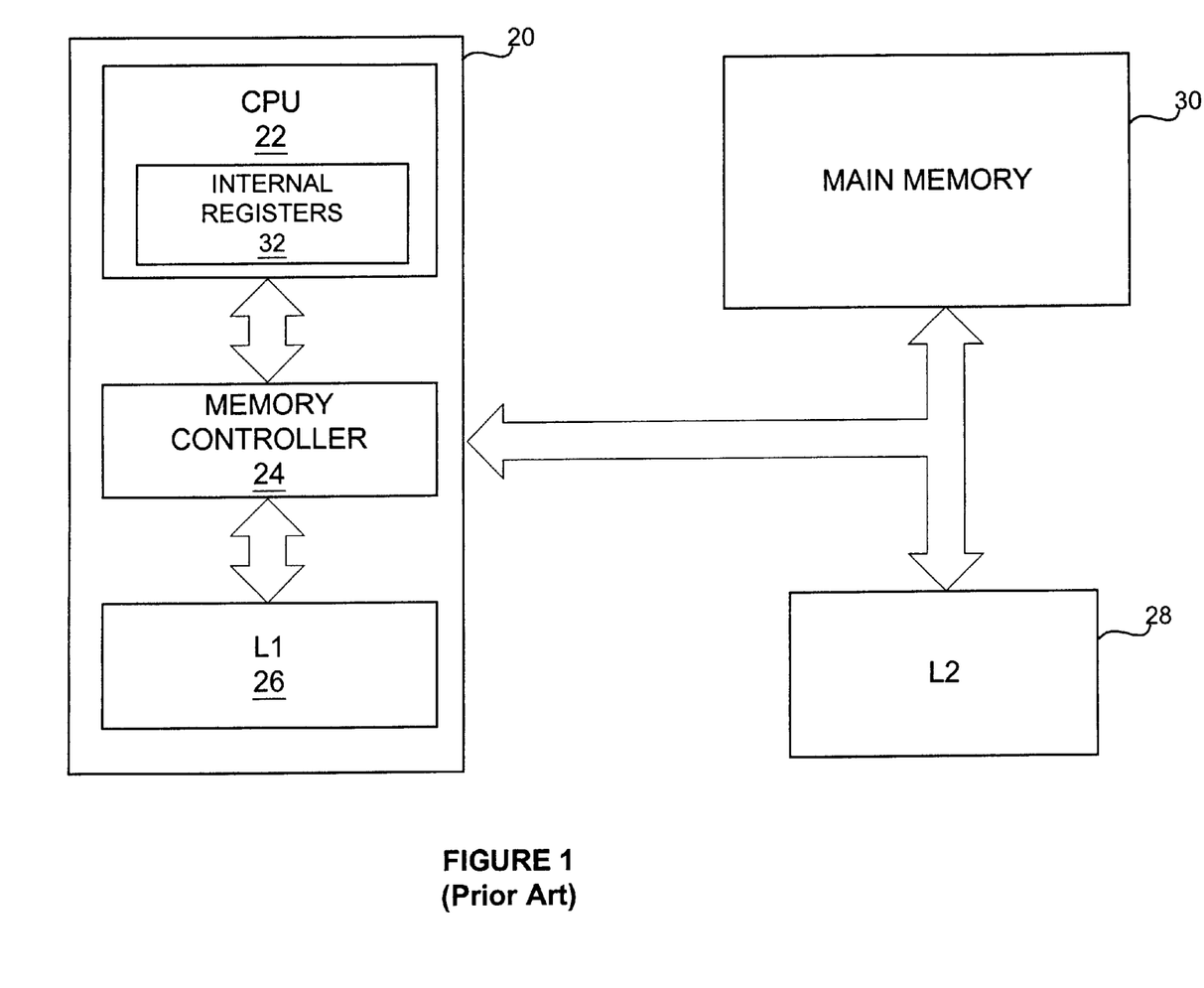
FIG. 1 shows a typical computer system.

A typical modem computer system includes a microprocessor, memory, and peripheral computer resources, e.g., monitor, keyboard, software programs, etc. The microprocessor has, among other components, arithmetic, logic, and control circuitry that interpret and execute instructions necessary for the operation of the computer system. FIG. 1 shows a typical computer system. The computer system has a microprocessor (20) that has a central processing unit ("CPU") (22), a memory controller (also known and referred to as a "load/store unit") (24), and on-board, or level 1 ("L1"), cache memory (26). The microprocessor (20) is also connected to main memory (30) and an external, or level 2 ("L2"), cache memory (28), both of which typically reside outside of the microprocessor (20).

In performing the various operations of the computer system, the microprocessor interprets and executes instructions provided by the computer system's users and/or computer programs. The execution of the microprocessor is carried out by the CPU (22). Data needed by the CPU (22) to carry out an instruction are fetched by the memory controller (24) and loaded into internal registers (32) of the CPU (22). Upon command from the CPU (22), the CPU (22) searches for the requested data in the internal registers (32). If the requested data is not available in the internal registers (32), the memory controller (24) searches for the requested data in the on-board cache memory (26). If that search turns out to be unsuccessful, the memory controller (24) then searches for the requested data in the external cache memory (28). If that search also turns out unsuccessful, the memory controller (24) retrieves the requested data from the slowest form of memory, the main memory (30).

The internal registers of the CPU are formed by a plurality of register files ("RFs") (not shown in FIG. 1). Register files are an integral part of a microprocessor because they are the local most memory available to the CPU. Typically, requested data that is in the on-board cache (26) or external cache (28) becomes available to the CPU three or more clock cycles after the cycle in which the CPU made the data request. However, requested data that is in the internal registers become available to the CPU during the same cycle or the first cycle after the cycle in which the CPU made the data request. Therefore, the speed and performance of the register files is a significant factor in determining the overall speed and performance of the microprocessor, and, in turn, the computer system.

Figure 2:
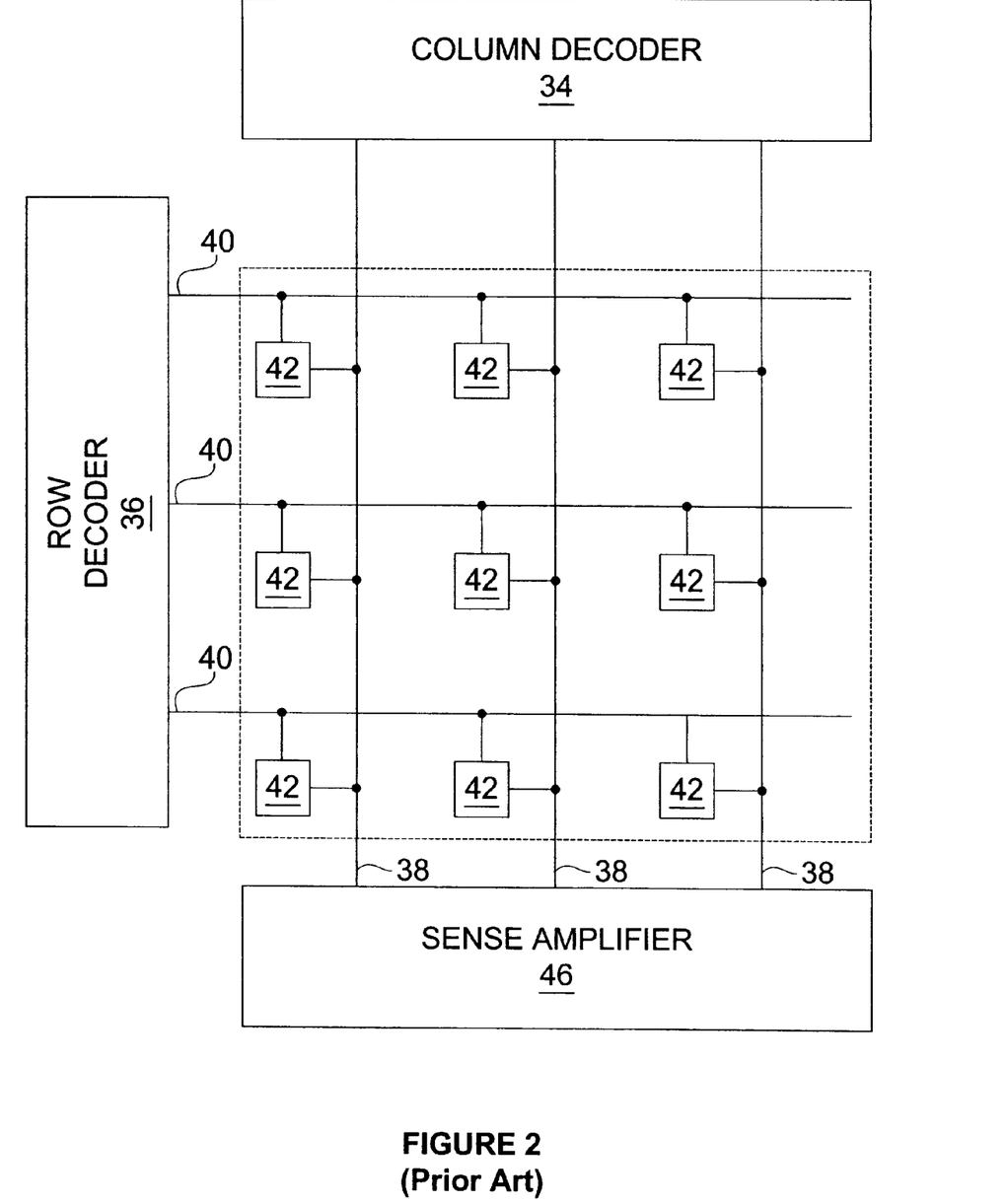
FIG. 2 shows a typical memory array.

Register files are generally arranged in one or more memory arrays. A memory array is a structure in which a plurality of memory elements are arranged such that data in each memory element can be accessed by selection of a particular pair of bit lines that used to read data from the memory array. FIG. 2 shows a typical memory array (44). In the memory array (44), data carrying wires that run column-wise through the memory array (44) are called bit lines (38). Data carrying wires that run row-wise through the memory array (44) are called word lines (40). Because a particular memory element (42) is connected to a distinct pair of a word line and a bit line, the size of the memory array (44), i.e., the maximum number of memory elements (42) that can be indexed and stored in the memory array (44), is equal to the number of word lines multiplied by the number of bit lines.

Selecting a particular memory element (42) occurs through a selection process known as "decoding." Decoding takes place through the use of a logical circuit known as a decoder. FIG. 2 shows a row decoder (36) and a column decoder (34). The row decoder (36) is used to select a word line (40) of the memory element (42) to be selected from the memory array (44). The column decoder (34) is used to select the bit line (38) of the memory element (42) to be selected from the memory array (44). As shown in FIG. 2, the memory element (42) to be selected is located at an intersection of the selected bit and word lines (38, 40). Once a particular memory element (42) is selected, a sense amplifier (46) senses, i.e., prospectively reads, the value stored in the particular memory element (42) and outputs the value to a data requesting component (not shown). From the foregoing discussion, it is apparent that as memory array sizes get larger to accommodate increased memory needs, the amount of time it takes to select a particular memory element from a memory array and the complexity of the selection process increases.

The row and column decoders (36, 34) shown in FIG. 2 select a word line (40) or bit line (38) based on address inputs applied to inputs of the row and column decoder (36, 34). The respective decoders then, through the decoding process, use the address to logically determine which particular word or bit line to select, i.e., activate. The decoding process within the row and column decoders (36, 34) is typically broken into two stages: a pre-decode stage and a final decode stage.

Figure 3:
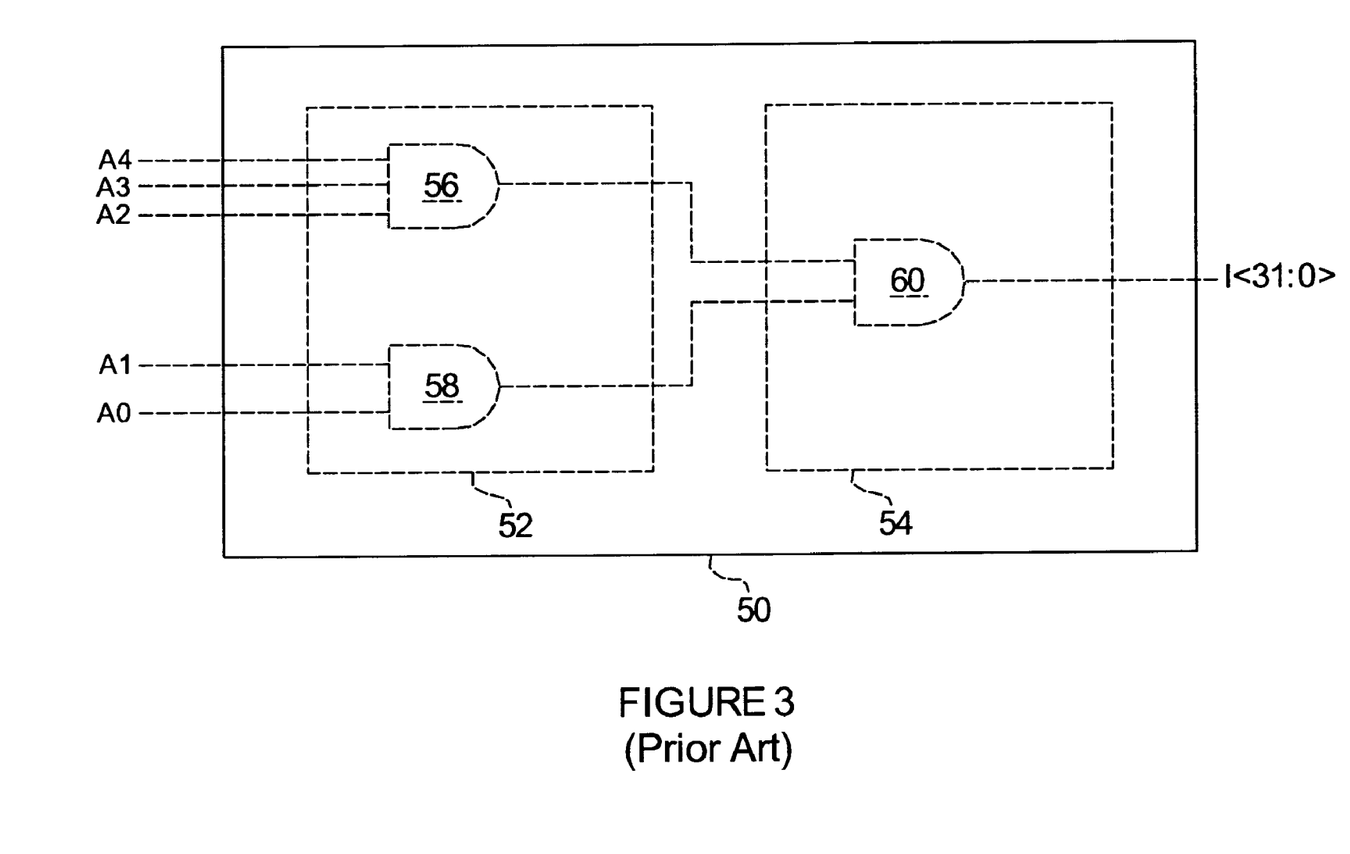
FIG. 3 shows a typical decoder having a pre-decode stage and a final decode stage.

FIG. 3 shows a typical decoding process of a decoder (50) having a pre-decode stage (52) and a final decode stage (54). The decoder (50) in FIG. 3 uses a 5-bit address, and therefore, the decoder (50) may be used to select among $2^5$, or 32, address lines. The pre-decode stage (52) is used to partially decode an address input, where after, the final decode stage (54) completes the decoding of the partially decoded value and selects the appropriate address line.

Still referring to FIG. 3, the pre-decode stage (52) and final decode stage (54) are constructed from AND gates operatively wired to an address input (shown in FIG. 3 as $a_4a_3a_2a_1a_0$) and an address line (shown in FIG. 3 as 1<31:0>) of a memory array (not shown). As mentioned above, depending on the values of $a_4$, $a_3$, $a_2$, $a_1$, and $a_0$, the address input can represent any one of $2^5$, or 32, address values.

Specifically, the pre-decode stage (52) is formed by 3-input AND gates (also referred to as "3-input pre-decoders") (56) and 2-input AND gates (also referred to as "2-input pre-decoders") (58) and the final decode stage (54) is formed by 2-input AND gates (also referred to as "final decoders") (60). As shown in FIG. 3, if the $a_4a_3a_2$ address bits are combined with 3-input pre-decoders (56), then eight 3-input pre-decoders (56) are needed, one for each of the eight possible bit combinations, e.g., 000, 001, 010, . . . , 111. Similarly, if the $a_1a_0$ address bits are combined with 2-input pre-decoders (58), then four 2-input pre-decoder gates are needed, one for each of the four possible bit combinations, e.g., 00, 01, . . . , 11. In the case where a pre-decode stage (52) uses two sets of gates, the final decode stage (54) ANDs the two sets of gates in the pre-decode stage (52). Hence, the final decode stage (54) uses 32 ($2^5$) 2-input final decoders (60), one for each of the 32 possible bit combinations, e.g., 00000, 00001, 00010, . . . , 11110, 111111.

Each of the eight 3-input pre-decoders (56) in the pre-decode stage (52) drives four final decoders (60) in the final decode stage (54). Accordingly, each of these eight 3-input pre-decoders (56) has a load of 4X, where X represents the load of one final decoder (60) in the final decode stage (54). Each of the four 2-input pre-decoders (58) in the pre-decode stage (52) drives eight final decoders (60) in the final decode stage (54). Accordingly, each of these four 2-input pre-decoder (58) has a load of 8X, where X represents the load of one final decoder (60).

Figure 4:
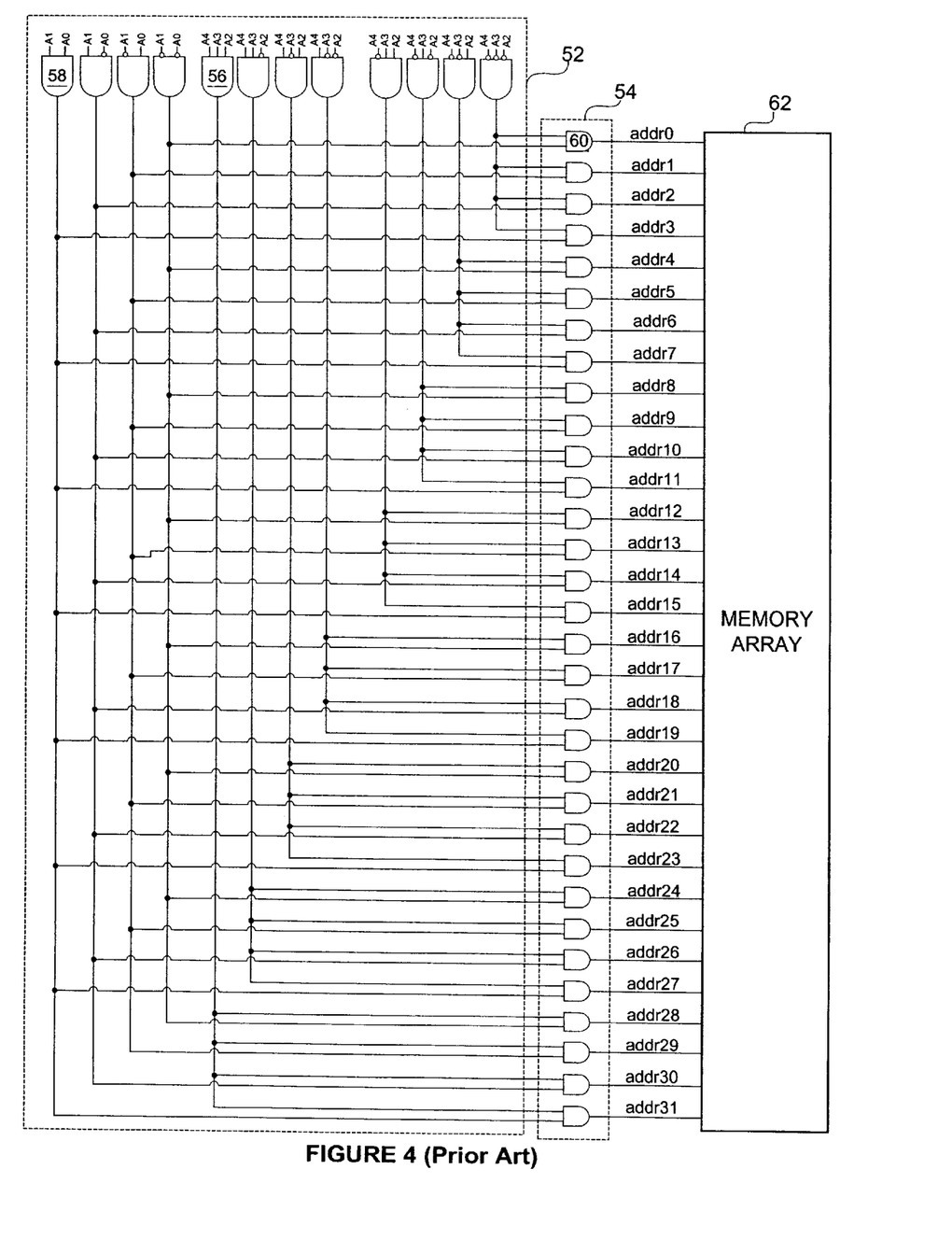
FIG. 4 shows a typical implementation of a decoder with a memory array.

FIG. 4 shows a representation of how the logic circuitry of the pre-decode stage (52) shown in FIG. 3 is connected to the logic circuitry of the final decode stage (54) shown in FIG. 3. As mentioned above, the 3-input pre-decoders (56) each drive four final decoders (60), and hence, each 3-input pre-decoder (56) has a gate load of 4X. Each 3-input pre-decoder (56) drives lumped group of four final decoders along ⅛ of the height of a memory array (62). Further, as mentioned above, the 2-input pre-decoders (58) each drive eight final decoders (60), and hence, each 2-input pre-decoder (58) has a gate load of 8X. Each 2-input pre-decoder (58) drives the wire along the height of the memory array (62) because a value of each 2-input pre-decoder (58) repeats at every fourth address (as shown in FIG. 4 as pattern $a_1a_0=00$). Hence, each 2-input pre-decoder (58) has a gate load of 8X in addition to the load of wire needed to travel the height of the memory array (62). Table 1 shows the final driver load, distribution, use of pre-decode wire, and allowed pre-decode placement in relation with the address combination discussed above.

TABLE 1

Address Combination, Load, and Gate Placement

| Address Combination | $a_4a_3a_2$ | $a_1a_0$ |
|---|---|---|
| final driver load | 4X | 8X |
| distribution | lumped group of 4 rows | distance repeats every 8 rows |
| pre-decode wire | ⅛ | full |
| allowed pre-decode placement | center | end |

As evidenced from Table 1 and the preceding discussion, there is a need for a pre-decode stage that places less load on particular gates and wires in the pre-decode stage. Meeting such a need will help increase computer system efficiency and performance.

SUMMARY OF INVENTION

According to one aspect of the present invention, an address decoder for a memory array comprises a pre-decode stage comprising logic circuitry adapted to partially decoding an address input and a final decode stage comprising additional logic circuitry adapted to further decoding the partially decoded address input and selecting a address line within the memory array, where the logic circuitry of the pre-decode stage is disposed in between ends of the final decode stage.

According to another aspect, a method for positioning circuitry of a decoder comprises determining a first combination of bits of an address input to an address decoder of a memory array and configuring pre-decode logic circuitry of the address decoder such that the first combination of bits corresponds to a first set of logic, wherein the determination of the first combination of bits is made so as to allow the first set of logic to be centrally positioned with respect to a length of the memory array.

According to another aspect, a method for decoding an address in order to select a memory element of a memory array comprises inputting a first combination of one or more address bits to a first set of logic gates, inputting at least one other combination of one or more address bits to another set of logic gates, and outputting signals from the first set of logic gates and the another set of logic gates to logic gates in a final decode stage, where the first set of logic gates and the another set of logic gates are positioned in between the logic gates in the final decode stage.

According to another aspect, an address decoder comprises pre-decode logic comprising a first logic gate and another logic gate, and final decode logic comprising a set of logic gates operatively connected to the pre-decode logic, where the first logic gate is positioned in the pre-decode logic such that signals outputted from the first logic gate are driven over up to half of the set of logic gates in the final decode logic.

Other aspects and advantages of the invention will be apparent from the following description and the appended claims.

DETAILED DESCRIPTION

Embodiments of the present invention relate to a pre-decode stage of a decoder that implements logic circuitry in between ends of a memory array.

Embodiments of the present invention further relate to a method for decoding address bits using centrally positioned pre-decode logic gates. Embodiments of the present invention further relate to a high performance address decode technique for a memory array.

Figure 5:
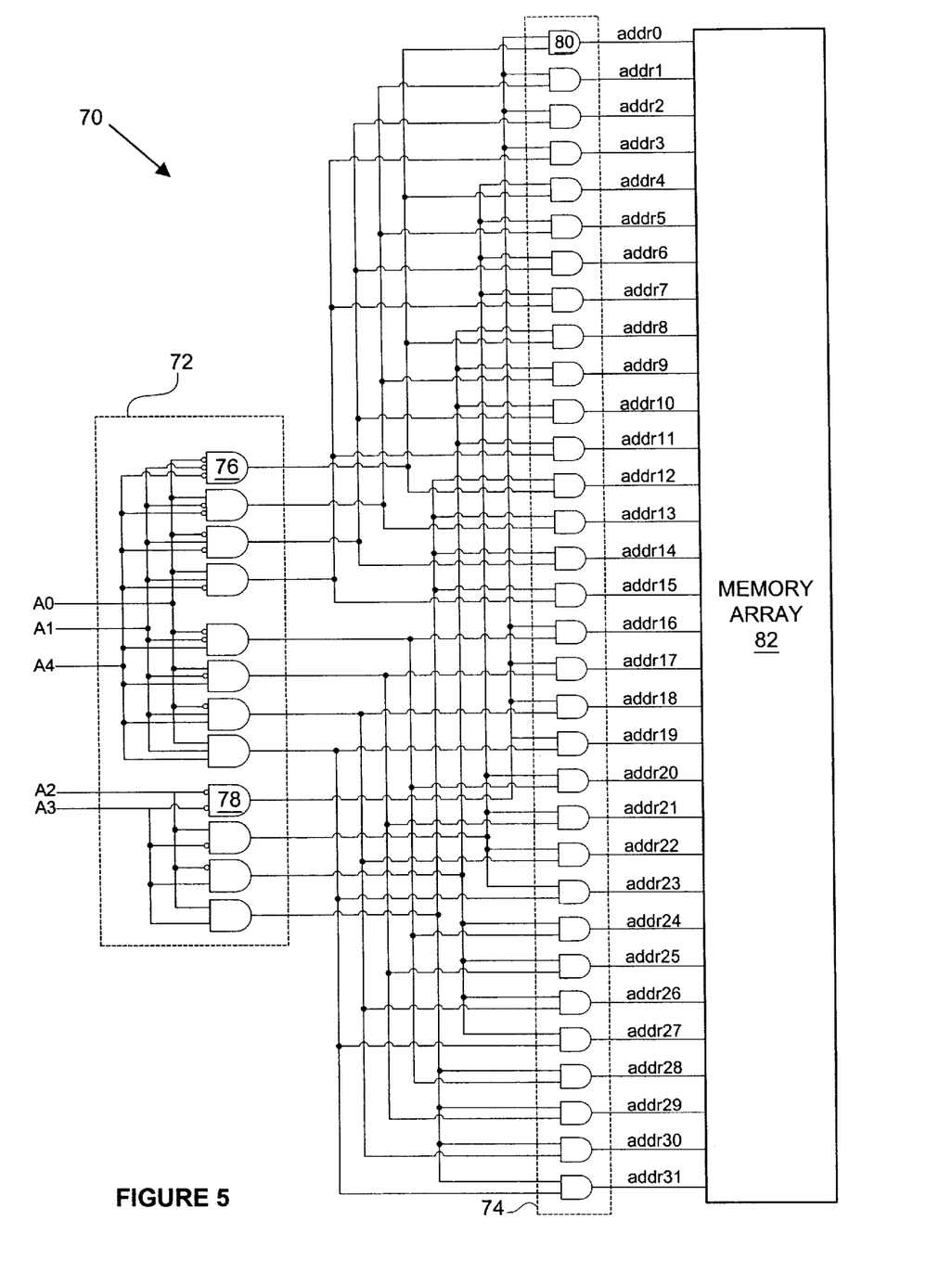
FIG. 5 shows an implementation of a decoder with a memory array in accordance with an embodiment of the present invention.

FIG. 5 shows an exemplary decoder (70) in accordance with an embodiment of the present invention. The decoder (70) has a pre-decode stage (72) that pre-decodes address bits $a_4$, $a_3$, $a_2$, $a_1$, and $a_0$ and a final decode stage (74) that completes the decoding of the partially decoded address bits and selects, i.e., the appropriate address line. The pre-decode stage (72) is shown using 3-input AND gates (also referred to as "3-input pre-decoders") (76) and 2-input AND gates (also referred to as "2-input pre-decoders") (78). The final decode stage (74) is shown using 2-input AND gates (also referred to as "final decoders") (80). The gates of the pre-decode stage (72) feed into the gates of the final decode stage (74) and the gates of the final decode stage (74) feed into a memory array (82). Those skilled in the art will appreciate that although the implementation in FIG. 5 is shown using 2- and 3-input AND gates, other equivalent or similar logic circuitry may be used.

In FIG. 5, the gates of the pre-decode stage (72) are centrally positioned relative to the length of the final decode stage (74). "Centrally positioned," for purposes of this invention including the claims means positioned in between the ends of the final decode stage. Thus, each pre-decoder gate (76, 78) drives its output, at a maximum, over half the final decoders (80).

In order to be able to centrally position pre-decoders (76, 78) relative to the final decode stage (74), inputs to the pre-decoders (76, 78) are chosen such that the respective outputs of the pre-decoders (76, 78) are driven over only the first half of addresses (addresses '0' through '15') or only the second half of addresses (addresses '16' through '31'). For example, in FIG. 5, the 3-input pre-decoder (76) is associated with address $a_4 a_1 a_0$ and the 2-input pre-decoder (78) is associated with address $a_3 a_2$. Thus, when ANDed together, the inputs of the 3-input pre-decoder (76) drive addresses '0,' '4,' '8,' and '12' and the inputs of the 2-input pre-decoder (78) drive addresses '0' through '3' and '16' through '19.' This means that the 2-input pre-decoder (78) drives the first half of the possible addresses and a small section of four address from the second half. Because the small section is adjacent to the first half of addresses, the 2-input pre-decoder (78) may still be centrally positioned relative to the height of the final decode stage (74).

Inputs to each gate of the pre-decode stage (72) are chosen by rearranging inputs to the pre-decode stage (72) until a combination that best optimizes the performance of the pre-decode stage (72) is found. For example, the five address bits inputted to the 3-input pre-decoder (76) and 2-input pre-decoder (78) may be arranged into ten possible input combinations as shown in Table 2.

TABLE 2

Possible Input Combinations for 5 Bit Address Input

|  | 3-input pre-decoder | 2-input pre-decoder |
| --- | --- | --- |
| 1st combination | a4 a3 a2 | a1 a0 |
| 2nd combination | a4 a3 a1 | a2 a0 |
| 3rd combination | a4 a3 a0 | a2 a1 |
| 4th combination | a4 a2 a1 | a3 a0 |
| 5th combination | a4 a2 a0 | a3 a1 |
| 6th combination | a4 a1 a0 | a3 a2 |
| 7th combination | a3 a2 a1 | a4 a0 |
| 8th combination | a3 a2 a0 | a4 a1 |
| 9th combination | a3 a1 a0 | a4 a2 |
| 10th combination | a2 a1 a0 | a4 a3 |

Of the possible combinations shown in Table 2, the 6th combination leads to the least amount of wire in the pre-decode stage (72). The long wire for the 3-input pre-decoder (76) is one-half the length of the final decode stage (74), and the long wire for the 2-input pre-decoder (78) is five-eights, one-half plus one-eighth, the length of the final decode stage (74). Table 3 shows the characteristics for this combination.

TABLE 3

Improved Address Combination, Load, and Gate Placement

| Address Combination | $a_4 a_1 a_0$ | $a_3 a_2$ |
| --- | --- | --- |
| final driver load distribution | 4X distance repeats every 4 rows | 8X lumped group of 4 rows |
| pre-decode wire | ½ | ½ + ⅛ |
| allowed pre-decode placement | center | center |

Those skilled in the art will appreciate that the technique used to determine the best combination of address inputs may be applied to all sorts of array structures. Further, those skilled in the art will appreciate that the technique used to determine the best combination of address inputs may be used for any number of address bits and/or any number of pre-decoder gates.

Advantages of the present invention may include one or more of the following. In some embodiments, because logic circuitry in a pre-decode stage of a decoder is centrally positioned relative to a length of a final decode stage, wire load on pre-decode wires is less than in cases where logic circuitry in the pre-decode stage is positioned at the ends of the final decode stage.

In some embodiments, because logic circuitry has to drive signals along a length of pre-decode wire shorter than the length along a final decode stage, pre-decode logic circuitry size may be reduced due to decreased drive strength needs.

In some embodiments, because centrally positioned pre-decode logic yields smaller logic circuitry size, integrated circuit area and power consumption is decreased.

In some embodiments, because pre-decode logic circuitry is centrally positioned relative to a length of a final decoder, time delay of operations conducted within a decoder is decreased.

In some embodiments, because pre-decode logic circuitry is centrally positioned relative to ends of a final decoder, uniform delay throughout the decoder may be achieved, effectively leading to increased operation performance, efficiency, and predictability.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An address decoder for a memory array, comprising:
   a pre-decode stage comprising logic circuitry adapted to partially decoding an address input; and
   a final decode stage comprising additional logic circuitry adapted to further decoding the partially decoded address input and selecting an address line within the memory array,
   wherein the logic circuitry of the pre-decode stage comprises:
      a first set of logic gates, and
      a second set of logic gates,
      wherein the logic gates of the first set input a first combination of one or more bits of the address input,
      wherein the logic gates of the second set input a second combination of one or more bits of the address input, and
      wherein the first combination and the second combination are chosen such that lengths of wires from the first set of logic gates to the final decode stage are substantially the same and lengths of wires from the second set of logic gates to the final decode stage are substantially the same.

2. The address decoder of claim 1, wherein the first combination and the second combination are dynamically determined using run-time software.

3. The address decoder of claim 1, wherein the final decode stage comprises:
   a set of logic gates operatively connected to the logic gates of the first set and the logic gates of the second set, wherein the set of logic gates of the final decode stage select the address line depending on inputs to the logic gates of the first set and the logic gates of the second set.

4. The address decoder of claim 3, wherein the first combination is chosen such that signals output from the first set of logic gates are driven over up to half of the logic gates of the final decode stage.

5. The address decoder of claim 4 wherein the second combination is chosen such that signals output from the second set of logic gates are driven over up to half of the logic gates of the final decode stage.

6. The address decoder of claim 1, wherein the first set of logic gates is disposed in between ends of the final decode stage.

7. The address decoder of claim 1, wherein the second set of logic gates is disposed in between ends of the final decode stage.

8. A method for decoding an address in order to select a memory element of a memory array, comprising:

inputting a first combination of one or more address bits to a first set of logic gates;

inputting a second combination of one or more address bits to a second set of logic gates; and outputting signals from the first set of logic gates and the second set of logic gates to logic gates in a final decode stage, wherein the first combination and the second combination are chosen such that lengths of wires from the first set of logic gates to the final decode stage are substantially the same and lengths of wires from the second set of logic gates to the final decode stage are substantially the same.

9. The method of claim 8, wherein the logic gates in the final decode stage are operatively connected to memory elements in the memory array.

10. The method of claim 8, wherein the first combination is pre-determined such that signals outputted from the first set of logic gates have to be driven over up to half of the logic gates in the final decode stage.

11. The method of claim 8, wherein the at least one other combination is pre-determined such that signals outputted from the another set of logic gates have to be driven over up to half of the logic gates in the final decode stage.

12. The method of claim 8, wherein the first set of logic gates is disposed in between ends of a final decode stage.

13. The method of claim 8, wherein the second set of logic gates is disposed in between ends of a final decode stage.

14. A method for connecting circuitry of a decoder, comprising:

determining a first combination of bits and a second combination of bits of an address input to an address decoder of a memory array;

configuring pre-decode logic circuitry of the address decoder such that the first combination of bits corresponds to a first set of logic gates; and configuring the pre-decode logic circuitry such that the second combination of bits corresponds to a second set of logic gates, wherein the determining is performed such that lengths of wires from the first set of logic gates to the decoder are substantially the same and lengths of wires from the second set of logic gates to the decoder are substantially the same.

15. The method of claim 14, wherein the first set of logic gates is disposed in between ends of a final decode stage.

16. The method of claim 14, wherein the second set of logic gates is disposed in between ends of a final decode stage.

17. The method of claim 14, wherein the determining is performed such that signals output from the first set of logic gates are driven over up to half of the logic gates in a final decode stage.

18. The method of claim 14, wherein the determining is performed such that signals output from the second set of logic gates are driven over up to half of the logic gates in a final decode stage.

* * * * *

UNITED STATES PATENT AND TRADEMARK OFFICE
CERTIFICATE OF CORRECTION

PATENT NO.     : 6,646,951 B2
DATED          : November 11, 2003
INVENTOR(S)    : Shree Kant et al.

It is certified that error appears in the above-identified patent and that said Letters Patent is hereby corrected as shown below:

<u>Column 7,</u>
Line 1, replace "4" with -- 3 --.

Signed and Sealed this

Ninth Day of March, 2004

JON W. DUDAS
*Acting Director of the United States Patent and Trademark Office*